United States Patent
Lei et al.

(10) Patent No.: US 12,444,656 B2
(45) Date of Patent: Oct. 14, 2025

(54) METHOD FOR MONITORING GATE OXIDE THICKNESS

(71) Applicant: Shanghai Huali Integrated Circuit Corporation, Shanghai (CN)

(72) Inventors: Haibo Lei, Shanghai (CN); Xingmei Yang, Shanghai (CN); Shenlong Xuan, Shanghai (CN); Wei Liu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 383 days.

(21) Appl. No.: 18/344,755

(22) Filed: Jun. 29, 2023

(65) Prior Publication Data
US 2024/0136233 A1  Apr. 25, 2024
US 2024/0234217 A9  Jul. 11, 2024

(30) Foreign Application Priority Data

Oct. 24, 2022  (CN) .......................... 202211305090.6

(51) Int. Cl.
*H01L 21/66* (2006.01)
*G01B 7/06* (2006.01)

(52) U.S. Cl.
CPC ................ *H01L 22/12* (2013.01); *G01B 7/08* (2013.01)

(58) Field of Classification Search
None
See application file for complete search history.

(56) References Cited

U.S. PATENT DOCUMENTS

2024/0136233 A1\*  4/2024  Lei .......................... H01L 22/12

\* cited by examiner

*Primary Examiner* — Jack S Chen
(74) *Attorney, Agent, or Firm* — Banner & Witcoff, Ltd.

(57) ABSTRACT

The present application provides a method for monitoring a gate oxide thickness: providing a device structure comprising a gate structure, a gate oxide layer under the gate structure, source and drain regions and a base region; applying a voltage −Vdd on the gate structure so that an accumulation layer is formed between the source and drain regions, applying a small AC voltage on the basis of the gate voltage −Vdd; grounding the source and drain regions; applying a voltage signal close to 0 potential on the base region; obtaining the capacitance Cox between the gate structure and the base region by testing; and obtaining the thickness of a gate oxide layer according to the formula Tox=ε\*S/Cox. This technique accurately monitors the thickness of the gate oxide layer, and avoids those errors caused by existing methods.

6 Claims, 2 Drawing Sheets

--- step I. providing a device structure comprising a gate structure, a gate oxide layer under the gate structure, source and drain regions and a base region

↓ step II: applying an AC voltage on the gate structure, the AC voltage varies in a range from -30mV - Vdd to +30mV − Vdd; Vdd is an operating voltage; wherein - Vdd generates an accumulation layer between the source and the drain regions when applied to the gate structure; wherein the source and the drain regions are grounded; and a voltage signal close to 0 potential is applied to the base region

↓ step III. obtaining a capacitance Cox between the gate structure and the base region according to a capacitance-voltage test method

↓ step IV. obtaining the thickness of the gate oxide layer according to formula Tox=ε\*S/Cox, where Tox is the gate oxide layer thickness; ε is a dielectric constant of the gate oxide; and S is the area of the gate oxide layer facing the P well step I. providing a device structure comprising a gate structure, a gate oxide layer under the gate structure, source and drain regions and a base region step II: applying an AC voltage on the gate structure, the AC voltage varies in a range from -30mV - Vdd to +30mV − Vdd; Vdd is an operating voltage; wherein - Vdd generates an accumulation layer between the source and the drain regions when applied to the gate structure; wherein the source and the drain regions are grounded; and a voltage signal close to 0 potential is applied to the base region step III. obtaining a capacitance Cox between the gate structure and the base region according to a capacitance-voltage test method step IV. obtaining the thickness of the gate oxide layer according to formula Tox=ε*S/Cox, where Tox is the gate oxide layer thickness; ε is a dielectric constant of the gate oxide; and S is the area of the gate oxide layer facing the P well

FIG. 2

METHOD FOR MONITORING GATE OXIDE THICKNESS

CROSS-REFERENCES TO RELATED APPLICATIONS

This application claims priority to Chinese patent application No. CN 202211305090.6, filed on Oct. 24, 2022 at CNIPA, and entitled "METHOD FOR MONITORING GATE OXIDE THICKNESS", the disclosure of which is incorporated herein by reference in entirety.

TECHNICAL FIELD

The present application relates to the field of semiconductor technology, and in particular, to a method for monitoring a gate oxide thickness.

BACKGROUND

The characteristic size of metal-oxide-semiconductor (MOS) devices has been reduced continuously towards higher density, higher speed, and lower power consumption. Meanwhile the power consumption generated by a gate leakage current has received increasing attentions, resulting in continuously reduced a gate oxide layer thickness Tox to suppress the short-channel effect. Thus, it has become important to monitor the thickness of the gate oxide layer of a MOS device. The gate oxide thickness Tox is monitored by a C—V characteristic curve in the field, where $Tox=\varepsilon*S/Cox$, where Cox is a gate oxide capacitance, $\varepsilon$ is the dietetics constant of the oxide layer, S is the surface area facing the active region, Cox=Ctotal (accumulation or inversion)−Cbeol (capacitance of the back end oxide layer between base region and gate). In the planar system like in process of 28 HK (high K), active area (RM AA) method is used to monitor the Cbeol. However, in a FinFET platform, on one hand, a metal-on-active layer (MOA) connected to an active region would deeply diffuse into a shallow-trench-isolation (STI) as MOA block, and on the other hand, the unique structure of FinFET enables Cof, a capacitance between a gate sidewall and a metal layer MOA, much larger than that of planar MOS. Thus, by RM AA method, a real structure cannot be fully blocked, so the gate oxide thickness Tox being monitored has a large margin of error. Therefore, it is crucial to propose a method to accurately monitor the gate oxide thickness Tox.

BRIEF SUMMARY

The present application provides a method for accurately monitoring a gate oxide thickness.

To achieve the above described purpose and other related purposes, the present application provides a method for monitoring a gate oxide thickness, including at least:

step I. providing a device structure including a gate structure, a gate oxide layer under the gate structure, source and drain regions and a base region;

step II. applying an AC voltage with a voltage varying around −Vdd on the gate structure, wherein the AC voltage varies in a range from −30 mV−Vdd to +30 mV−Vdd; wherein Vdd is an operating voltage; −Vdd indicates that the voltage applied to the gate structure causes an accumulation layer formed between the source and drain regions; the source and drain regions are grounded; and a voltage signal close to 0 potential is applied to the base region;

step III. obtaining the capacitance Cox of the gate oxide layer; and step IV. obtaining the thickness of the gate oxide layer according to the relationship $Tox=\varepsilon*S/Cox$, here Tox represents the thickness of the gate oxide layer, $\varepsilon$ is a dielectric constant of the gate oxide layer, and S represents the area of the region of the gate oxide layer covering the active region which is the P well in this structure.

According to one embodiment, the device structure in step I includes: a substrate; and a P well on the substrate; the gate oxide layer is located on the upper surface of the P well; the gate structure is located on the gate oxide layer; the side walls of the gate structure are provided with spacers; an N+ region is disposed within the P well at both sides of the gate structure, and the N+ region includes the source and drain regions; and a P+ region is disposed within the P well, and the P+ region forms the base region.

According to one embodiment, a metal structure is provided on the N+ region, the P+ region and the gate structure in step 1.

According to one embodiment, the metal structure on the N+ region in step I includes a metal wire MOA in contact with the N+ region; an insulating medium is located on the metal wire MOA; a first metal wire M1 is provided on the insulating medium; the metal wire on the gate structure and the P+ region includes the metal wire MOA directly in contact with the gate structure and the P+ region; a first through-hole filled with metal is located in the metal wire MOA; and a first metal wire M1 is located on the first through-hole.

According to one embodiment, the capacitance Cox of the gate oxide layer is obtained by collecting in the base region by a Wafer Acceptance Test (WAT) in step 3.

According to one embodiment, a voltage −Vdd is applied to the gate structure by the first metal wire M1 in step II; the source and drain regions are grounded by the first metal wire M1 on the source and drain regions; and a voltage signal close to 0 potential is applied to the base region by the first metal wire M1 on the base region.

As mentioned above, this technique for monitoring a gate oxide thickness according to the present application has the following beneficial effects: for the FinFET platform-based gate oxide layer, it enables a more precisely measured capacitance of the gate oxide layer, thus a more accurately monitored thickness of the gate oxide layer than the existing methods, thereby avoiding the errors caused by the existing t method. The method according to the present disclosure is also simple and easy to implement.

BRIEF DESCRIPTION OF THE DRAWINGS

FIG. 2 shows a flow chart of to method for monitoring a gate oxide thickness according to the present application.

DETAILED DESCRIPTION OF THE DISCLOSURE

Figure 1:
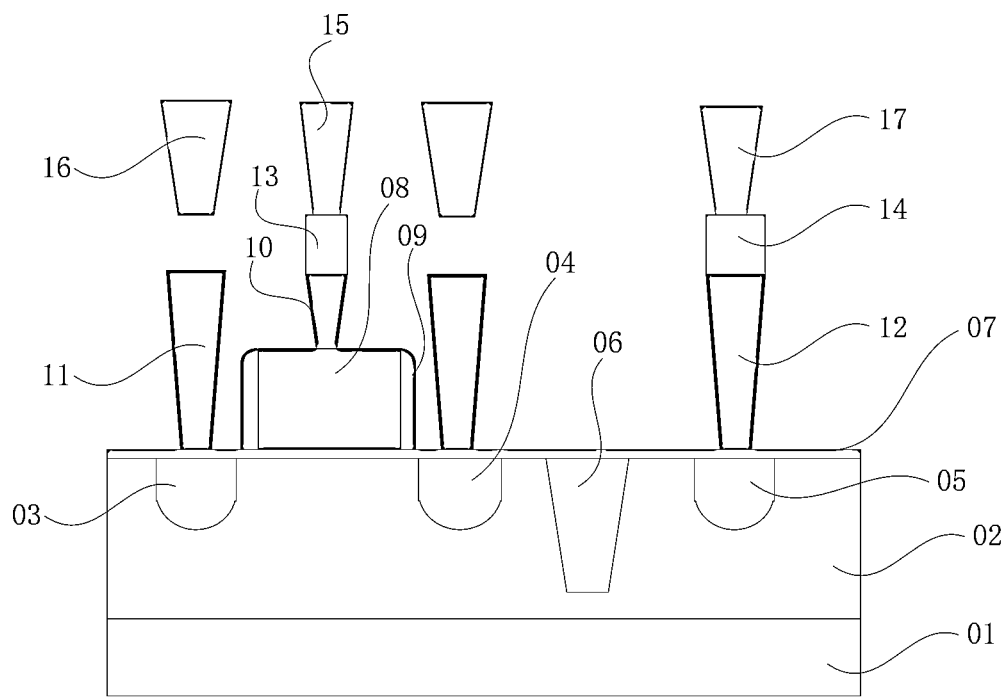
FIG. 1 shows a schematic diagram of a device structure used to detect a gate oxide thickness according to the present application.

The implementation of the application is illustrated in the following by specific embodiments, and other advantages and effects of the present application can be readily understood by those skilled in the art from the disclosure in the description. The present application may also be implemented or applied by further different specific implementations, and details in the description may be modified or changed in various ways based on different views and applications without departing from the spirit of the present application.

Please refer to FIG. 1 to FIG. 2. It should be noted that the illustrations provided in the embodiments schematically illustrate the basic concept of the present application. The figures only show components related to the application and are not drawn according to the number, shape and size of components in actual implementation, and the pattern, number and proportion of the components in actual implementation may be arbitrarily changed, and the layout pattern of the components may be more complex.

The present application provides a method for monitoring a gate oxide thickness, and referring to FIG. 2, it shows a flow chart of the method for monitoring a gate oxide thickness according to the present application, the method includes at least the following steps:

step I. providing a device structure which includes a gate structure, a gate oxide layer under the gate structure, source and drain regions and a base region; wherein the device structure provided in step I is a FinFET platform-based device structure.

Further in the present application, the device structure in step I of this embodiment also includes: a substrate; and a P well on the substrate; the gate oxide layer is located on the upper surface of the P well; the gate structure is located on the gate oxide layer; the side walls of the gate structure is provided with spacers; an N+ region is provided within the P well at both sides of the gate structure, and the N+ region forms the source and drain regions; and a P+ region is provided within the P well, and the P+ region forms the base region.

Further in the present application, a metal structure is provided on the N+ region, the P+ region and the gate structure in step I step I of this embodiment.

Referring to FIG. 1, it shows a schematic diagram of a device used to detect a gate oxide thickness in the present application; and the FinFET platform-based device structure is provided in step I, which includes a gate structure 08, a gate oxide layer 07 under the gate structure 08, source and drain regions and a base region.

The device structure of this embodiment also includes: a substrate 01; and a P well 02 located on the substrate 01; a gate oxide layer 07 is located on the upper surface of the P well 02; the gate structure 08 is located on the gate oxide layer 07; the side walls of the gate structure 08 are disposed with spacers 09; N+ regions including a first N+ region 03 and a second N+ region 04 are respectively disposed at both sides of the gate structure 08 in the P well 02, the N+ region includes the source and drain regions (the first N+ region 03 forms a source region; and the second N+ region 04 forms a drain region); and a P+ region 05 is also provided in the P well 02, and the P+ region 05 forms the base region. Metal structures are formed on the N+ region (both the first N+ region 03 and the second N+ region 04), the P+ region 05 and the gate structure 08.

Further in the present application, the metal structure on the N+ region in step I of this embodiment includes a metal wire MOA over the N+ region; an insulating medium is located on the metal wire MOA; a first metal wire M1 is provided on the insulating medium; the metal wire on the gate structure and the P+ region includes the metal wire MOA directly in contact with the gate structure and the P+ region; a first through-hole later filled with metal to form the metal wire MOA; and a first metal wire M1 fills in the first through-hole.

Referring to FIG. 1, that is, the metal structures on the N+ region (the first N+ region 03 and second N+ region 04) include a metal wire MOA (11) on the N+ region; the metal wire on the gate structure 08 includes a metal wire MOA (10) in direct contact with the gate structure 08; and the metal wire on the P+ region 05 includes a metal wire MOA (12) on the P+ region 05. First through-holes (13 and 14) are formed on the metal wires MOAs (the metal wires MOA (10 and 12)) and then filled with metal; and first metal wires M1 (15 and 17) are disposed on the metal filled first through-holes (13 and 14). the first through-holes (13 and 14) are filled with metal so they are electrically connected to the metal wire MOA (10) on the gate structure 08 and also on the metal wire MOA (12) on the P+ region 05. There is no metal filled within the first through holes located above the N+ region.

The method includes step II. applying an AC voltage varying in a range around −Vdd applied on the gate structure, the range of the AC voltage variation is −30 mV−Vdd to +30 mV−Vdd; wherein Vdd is an operating voltage; −Vdd indicates that the voltage applied to the gate structure generates an accumulation layer between the source and drain regions; the source and drain regions are grounded; and a voltage signal close to 0 potential is applied on the base region.

Further in the present application, in step II of this embodiment, a voltage −Vdd is applied to the gate structure by the first metal wire M1 in step II; the source and drain regions are grounded by the first metal wire M1 (16) on the source and drain regions; and the voltage signal close to 0 potential is applied to the base region by the first metal wire M1 (17) on the base region.

That is, in this step II, a voltage −Vdd is applied to the gate structure, where Vdd is the operating voltage; and −Vdd indicates that the voltage applied to the gate structure causes an accumulation layer formed between the source and drain regions; and thus, the gate oxide layer is used as an insulating medium between a gate and a channel, thus forming a capacitance.

The source and drain regions are grounded; and the voltage signal close to 0 potential is applied to the base region. In this embodiment, the voltage −Vdd is applied by the first metal wire M1 (15) on the gate structure; the source and drain regions are grounded by the first metal wire M1 (16) on the source and drain regions; and the voltage signal close to 0 potential is applied to the base region by the first metal wire M1 (17) on the base region.

The method includes step III: obtaining a capacitance Cox between the gate structure and the base region according to a capacitance-voltage test method; that is, the gate structure in the device structure (a test structure) according to the present application is far away from a connection line of a rear section of the base region (bulk), and the back-end-of-line (Beol) capacitance between the gate structure and the base region can be neglected, so the capacitance Cox between the gate structure and the base region can be measured directly, which capacitance is the capacitance of the gate oxide layer.

Further in the present application, the capacitance Cox of the gate oxide layer is obtained by collecting in the base region by the WAT test in step III of this embodiment according to the present application.

The method includes step IV: obtaining the thickness of the gate oxide layer according to the relationship formula $Tox=\varepsilon*S/Cox$, where Tox represents the thickness of the gate oxide layer; ε is a dielectric constant of the gate oxide; and S represents the area of the region of the gate oxide layer facing the P well.

In summary, the method for monitoring a thickness of a FinFET platform-based gate oxide proposed in the present application enables the relatively precise measured capacitance of the gate oxide layer and thus the relatively accurate monitored thickness of the gate oxide layer, avoiding the errors caused by a traditional method, and the present method is simple and is easy to implement. Therefore, the present application effectively overcomes the shortcomings of the current technique and has a high industrial value for application.

The above embodiments are only illustrative of the principle of the application and effects thereof, and are not intended to limit the application. Any person skilled in the art may modify or change the above embodiments without departing from the spirit and scope according to the present application. Therefore, all equivalent modifications or alterations made by those skilled in the art shall still be covered by the claims of the present application without departing from the spirit and technical ideas revealed by the present application.

What is claimed is:

1. A method for monitoring a gate oxide thickness, comprising at least:
    step I. providing a device structure comprising a gate structure, a gate oxide layer under the gate structure, a source region, a drain region, and a base region;
    step II. applying an AC voltage on the gate structure, wherein the AC voltage varies in a range from −30 mV−Vdd to +30 mV−Vdd, wherein Vdd is an operating voltage; wherein −Vdd generates an accumulation layer between the source region and the drain region when applied to the gate structure; wherein the source region and the drain region are grounded; and wherein a voltage signal close to 0 potential is applied to the base region;
    step III. obtaining a capacitance Cox between the gate structure and the base region according to a capacitance-voltage test method; and
    step IV. obtaining the gate oxide thickness of the gate oxide layer according to a formula Tox=ε*S/Cox, where Tox is the gate oxide thickness; ε is a dielectric constant of the gate oxide layer; and S is an area of the gate oxide layer facing a P well.

2. The method for monitoring the gate oxide thickness according to claim 1, wherein the device structure in step I further comprises: a substrate; and a P well on the substrate; wherein the gate oxide layer is disposed on a upper surface of the P well; wherein the gate structure is disposed on the gate oxide layer; wherein side walls of the gate structure are provided with spacers; wherein an N+ regions are provided within the P well at both sides of the gate structure, and wherein the N+ regions form the source region and the drain region; and wherein a P+ region is disposed within the P well, and wherein the P+ region forms the base region.

3. The method for monitoring the gate oxide thickness according to claim 2, wherein the step I further comprises forming metal structures on the N+ regions, the P+ region and the gate structure.

4. The method for monitoring the gate oxide thickness according to claim 3, wherein forming the metal structures on the N+ regions in step I further comprises: forming metal wire MOA in contact with the N+ regions, forming an insulating medium on the metal wire MOAs,
    forming a first metal wire M1 on the insulating medium of the metal wire MOAs;
    forming a metal wire on and directly in contact with the gate structure, and
    forming a metal wire on and directly in contact with the P+ region; and
    forming first through-holes on the insulating medium of the metal wire MOAs on the source region and the drain region, and filling the first through-holes with the first metal wire M1.

5. The method for monitoring the gate oxide thickness according to claim 1, wherein obtaining the capacitance Cox of the gate oxide layer comprises collecting data between the gate structure and the base region according to a capacitance-voltage WAT test in step III.

6. The method for monitoring the gate oxide thickness according to claim 1, wherein the voltage −Vdd is applied to a first metal wire M1 of the gate structure in step II; wherein the source region and the drain region are grounded by the first metal wire M1 on the source region and the drain region; and wherein a voltage signal close to 0 potential is applied to the first metal wire M1 on the base region.

* * * * *